(12) United States Patent
Mirjafari et al.

(10) Patent No.: US 10,998,072 B2
(45) Date of Patent: May 4, 2021

(54) CONFIGURABLE VOLTAGE REGULATOR CONTROLLERS

(71) Applicant: Dell Products, L.P., Round Rock, TX (US)

(72) Inventors: Mehran Mirjafari, Austin, TX (US); Bhavesh Govindbhai Patel, Austin, TX (US); John J. Breen, Harker Heights, TX (US); Lei Wang, Austin, TX (US)

(73) Assignee: Dell Products, L.P., Round Rock, TX (US)

( * ) Notice: Subject to any disclaimer, the term of this patent is extended or adjusted under 35 U.S.C. 154(b) by 182 days.

(21) Appl. No.: 15/599,903

(22) Filed: May 19, 2017

(65) Prior Publication Data

US 2018/0335822 A1 Nov. 22, 2018

(51) Int. Cl.
| | |
|---|---|
| *G11C 29/02* | (2006.01) |
| *G11C 5/14* | (2006.01) |
| *G06F 1/26* | (2006.01) |
| *H04L 12/24* | (2006.01) |
| *G11C 29/04* | (2006.01) |

(52) U.S. Cl.
CPC .............. *G11C 29/028* (2013.01); *G06F 1/26* (2013.01); *G11C 5/147* (2013.01); *G11C 29/021* (2013.01); *H04L 41/0806* (2013.01); *G11C 2029/0407* (2013.01)

(58) Field of Classification Search
CPC .. G06F 16/1734; G06F 16/90; G06F 16/9537; G06F 1/266; G06F 1/3203; G06F 3/0679; G06F 1/26; G11C 14/00; G11C 2029/0407; G11C 29/021; G11C 29/028; G11C 5/147; H04L 41/04; H04L 41/0806

USPC .................................................. 707/600–899
See application file for complete search history.

(56) References Cited

U.S. PATENT DOCUMENTS

| | | | | |
|---|---|---|---|---|
| 2004/0138833 A1* | 7/2004 | Flynn | .................... | G06F 1/3203 702/58 |
| 2006/0279350 A1 | 5/2006 | Zhang et al. | | |
| 2007/0013350 A1* | 1/2007 | Tang | .................... | H02M 3/1584 323/237 |
| 2007/0262132 A1* | 11/2007 | Burton | ...................... | G06F 1/26 235/375 |
| 2009/0141783 A1* | 6/2009 | Kirrmann | ........... | H04W 52/267 375/219 |
| 2010/0201405 A1* | 8/2010 | Ahmad | ............... | H02M 3/1584 327/108 |

(Continued)

OTHER PUBLICATIONS

IBM, "Scalable server voltage regulator design." 2004, 26.

(Continued)

*Primary Examiner* — Irete F Ehichioya
*Assistant Examiner* — Xiaoqin Hu
(74) *Attorney, Agent, or Firm* — Fogarty LLP

(57) ABSTRACT

Systems and methods for configurable voltage regulator (VR) controllers. In some embodiments, an Information Handling System (IHS) may include: a processor; and a voltage regulator (VR) coupled to the processor, the VR configured to: identify, via a VR controller, a number of phases coupled to the voltage regulator in response to detection of a power-on-reset event; and select, via the VR controller, one of a plurality of different configuration files to be applied to the voltage regulator in response to the identification.

10 Claims, 3 Drawing Sheets

(56) References Cited

U.S. PATENT DOCUMENTS

2013/0245854 A1    5/2013  Rinne et al.
2015/0280563 A1*  10/2015  Tang .................... H02M 3/158
                                                          323/271
2015/0310331 A1*  10/2015  Rolston ................ G06N 5/025
                                                          700/298
2016/0070335 A1*   3/2016  Mitrea ................. G06F 1/3243
                                                          713/323

OTHER PUBLICATIONS

RENESAS: "ID 820C Scalable voltage regulator(VR)," 2010, 57.
IBM, "A scalable distributed regulator architecture for the POWER8 Microprocessor," 2014, 28.

* cited by examiner

CONFIGURABLE VOLTAGE REGULATOR CONTROLLERS

FIELD

The present disclosure generally relates to Information Handling Systems (IHSs), and, more particularly, to configurable voltage regulator (VR) controllers.

BACKGROUND

As the value and use of information continues to increase, individuals and businesses seek additional ways to process and store information. An option is an Information Handling System (IHS). An IHS generally processes, compiles, stores, and/or communicates information or data for business, personal, or other purposes. Because technology and information handling needs and requirements may vary between different applications, IHSs may also vary regarding what information is handled, how the information is handled, how much information is processed, stored, or communicated, and how quickly and efficiently the information may be processed, stored, or communicated.

Variations in IHSs allow for IHSs to be general or configured for a specific user or specific use, such as financial transaction processing, airline reservations, enterprise data storage, global communications, etc. In addition, IHSs may include a variety of hardware and software components that may be configured to process, store, and communicate information; and may include one or more computer systems, data storage systems, and/or networking systems.

Inside enterprise servers, storage devices, and networking appliances, as well as many other types of IHSs, voltage regulators (VR) are deployed to provide low-voltage (e.g., 1.8 V, 1.2 V, etc.) power to the IHS's Central Processing Unit (CPU), memory, and other electronic loads. An example of a VR commonly used in IHSs is the multi-phase buck converter.

The inventors hereof have recognized, however, that IHS components with different power ratings may require that a different number of phases or power modules be present in a given VR. To address these, and other issues, the inventors hereof have developed various configurable VR controllers described herein.

SUMMARY

Embodiments of configurable voltage regulator (VR) controllers are described. In an illustrative, non-limiting embodiment, an Information Handling System (IHS) may comprise: a processor; and a voltage regulator (VR) coupled to the processor, the VR configured to: identify, via a VR controller, a number of phases coupled to the voltage regulator in response to detection of a power-on-reset event; and select, via the VR controller, one of a plurality of different configuration files to be applied to the voltage regulator in response to the identification.

The VR controller further may include a Random-Access Memory (RAM) having a plurality of control registers. The VR controller may further include a Non-Volatile Memory (NVM) coupled to the RAM, where the NVM includes the plurality of different configuration files. The VR controller may further include a logic circuit coupled to the NVM and to the RAM, wherein the logic circuit is configured to detect a population of phases, retrieve the selected configuration file from the NVM, and load configuration parameters from the selected configuration file into corresponding ones of the control registers.

In some cases, each of the plurality of configuration files corresponds to a different number of power modules coupled to the voltage regulator. The VR controller may include: a logic circuit coupled to the NVM and to the RAM, wherein the logic circuit is configured to combine (a) a first configuration file portion applicable to any number of power modules, with (b) a second configuration file portion selected among a plurality of other configuration file portions, each of the plurality of other configuration file portions having different parameters specific to different numbers of power modules.

The first configuration file portion may be stored in the NVM and the second configuration file portion may be stored in a Baseband Management Controller (BMC) coupled to the processor. Additionally or alternatively, the BMC may be configured to receive an indication of the number of phases usable by the processor and to provide the selected configuration file to the voltage regulator. The VR controller may be configured to identify an absence of a phase module and to abstain from sending a Pulse-Width Modulated (PWM) signal to a bay corresponding to the absent phase module.

In another illustrative, non-limiting embodiment, a method may implement one or more of the aforementioned operations. In yet another illustrative, non-limiting embodiment, a hardware memory device may have program instructions stored thereon that, upon execution by an IHS, cause the IHS to perform one or more of the aforementioned operations.

BRIEF DESCRIPTION OF THE DRAWINGS

The present invention(s) is/are illustrated by way of example and is/are not limited by the accompanying figures. Elements in the figures are illustrated for simplicity and clarity, and have not necessarily been drawn to scale.

DETAILED DESCRIPTION

Figure 1:
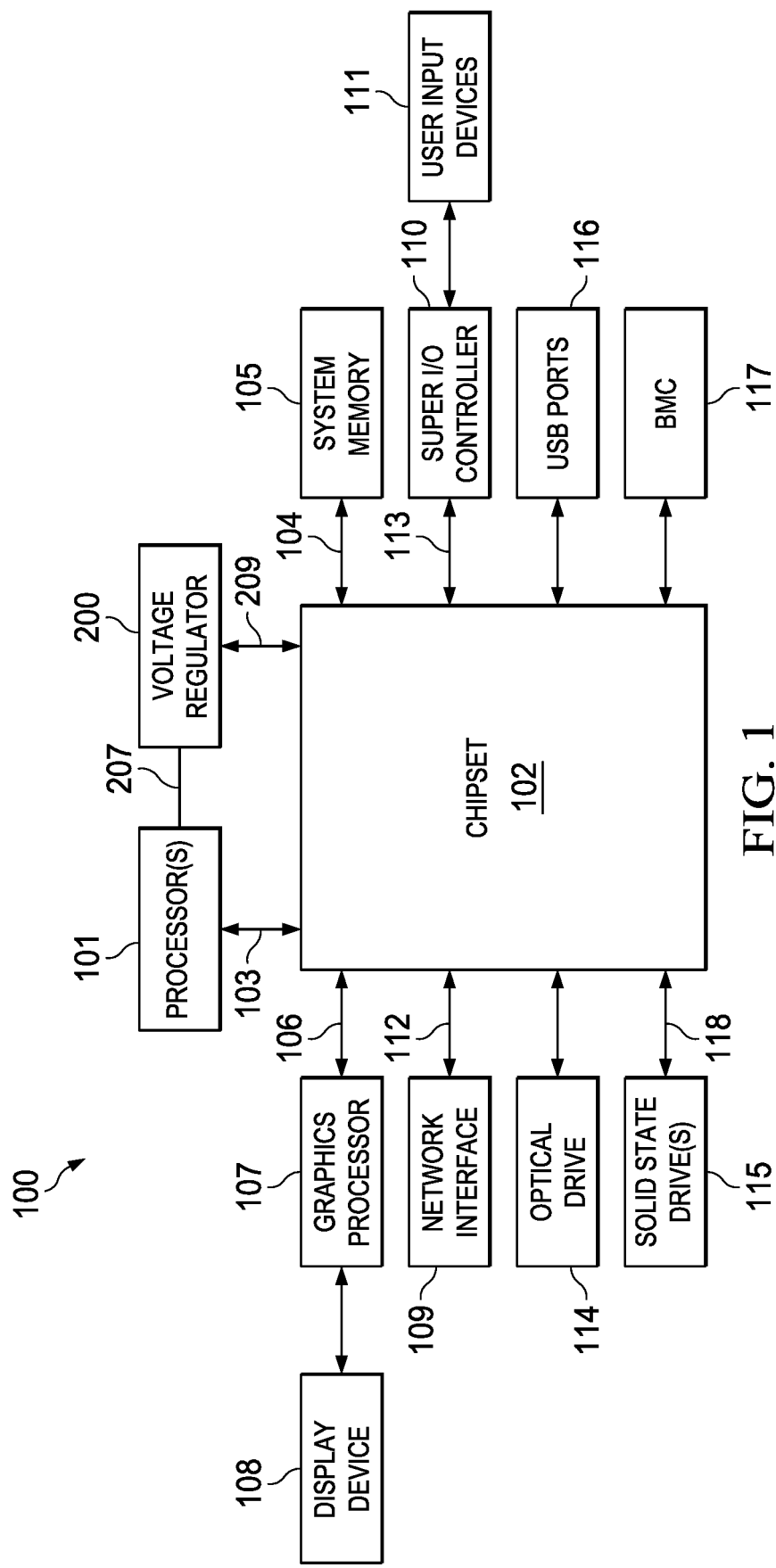
FIG. 1 illustrates an example of an Information Handling System (IHS) according to some embodiments.

Voltage regulators (VR) are often employed to provide low-voltage power to Central Processing Units (CPUs), memory, chipsets, and/or other electronic components within an Information Handling System (IHS). Some VRs are soldered onto an IHS's motherboard or Printed Circuit Board (PCB), while other VRs are installed in an open slot designed especially to accept modular components. Typically, VRs are implemented as multi-phase buck converters for higher voltage rails.

Depending upon a CPU's power rating or requirements, the number of phases or power modules inside the VR may vary. For example, a 160 W CPU may need 6 phases. However, an 80 W CPU may only need 3 phases. In certain platforms, VRs may be required to support different CPUs with power requirements that range from 60 W to 145 W.

In many cases, an IHS manufacturer may populate a VR with all of the necessary number of phases for the highest supported CPU available for a particular platform, line, series, or model of IHS; whether or not all those phases will be ultimately needed in each different end-user or customer machine. For example, the IHS manufacturer may allow a customer to purchase a "base model" IHS, along with any number of different CPUs that can be installed or switched out in that base model, and each CPU may have its own distinct power requirements.

At one end of the spectrum, an IHS manufacturer may include a VR in the base model with all of its power modules present, regardless of whether the CPU that will ultimately be included in the IHS actually needs all of those power modules. This approach facilitates IHS production and provides customers with a wider range of customization options; but employing more power modules than necessary can be expensive.

At the other end of the spectrum, the IHS manufacturer may use different VRs, each with a number of phases individualized for each different CPU. However, this particular approach can make future CPU upgrades difficult or unviable.

As the inventors hereof have recognized, however, most VR controllers use a "configuration file." The VR configuration file may be stored in the VR controller's own firmware, and it may include settings and/or parameters necessary to enable the VR's operation. Traditionally, a VR's configuration file would be selected during manufacturing of the VR controller, and it would be practically unchangeable later on, for example, by an IHS manufacturer or by an end-user.

Configuration files may be programmed into the VR controller's firmware by the VR controller manufacturer prior to shipping of the VR controller to the IHS manufacturer, who then assembles the VR controller as part of its IHS. However, more than two part numbers (P/N) are required to identify any given VR controller: a first P/N for a VR controller chip with first configuration file itself, and a second P/N for that same VR controller chip after it having been programmed with a second different configuration file. After its programming, the VR controller chip is put in tape-and-reel and shipped to the IHS's manufacturer.

In various embodiments described herein, however, settings and parameters used by control loop circuitry within the VR may be dynamically configurable based upon the number of populated phases or power modules and/or upon a given CPU's power rating or requirements. Additionally or alternatively, and still in contrast with traditional approaches, in many cases a VR as described herein may require a single P/N.

For example, in a first embodiment, different configuration files may be pre-stored in a non-volatile memory (NVM) within the VR controller during the manufacturing of the VR controller itself, and prior to the shipping of the VR controller chip to the IHS manufacturer. Each different configuration file may be stored in a different area or address of the NVM, and each different file may include all of the settings and parameters for a selected IHS or VR configuration.

In a second embodiment, the configuration file may assembled on-the-fly using at least two different portions: a first portion that includes fixed settings and parameters needed by the VR independently of any number of phases present and/or any CPU power requirements; and a second portion that is dependent upon number of phases present and/or any CPU power requirements. The first portion of the configuration file may be stored in a first area or address of the NVM, and a plurality of different second portions may each be stored in a respective area of the NVM. Depending upon the number of phases detected and/or the CPU's power requirements, which may be detected upon initialization of the VR, the VR may select a different one of the plurality of second portions such that, when the phase or CPU-dependent settings or parameters of the second portion are combined with the fixed settings or parameters of the first portion, the VR controller can create a full configuration file that includes all of the settings and parameters for that particular IHS or VR configuration.

In yet a third embodiment, the various "second portions" mentioned above may be provided by an IHS's Baseband Management Controller (BMC), which is outside of and distinct from the VR. These BMC-acquired second portions may have been stored in the BMC itself, or may be retrieved from a remote server or the like by the BMC upon the VR's detection of the number of phases present and/or CPU power requirements.

Accordingly, among many other features, systems and methods described herein may provide configurable VRs that are capable to identify a number of phases or power modules populating the VR and/or required by a particular CPU, and retrieve and/or dynamically assemble a VR configuration file appropriate for that environment. Should the CPU be replaced by another processor that requires a different number of phases or power modules, and/or should the number of power modules in the VR change (e.g., due to failure), the same VR may recognize the change upon the VR's initialization, and the VR may generate or retrieve another configuration file appropriate for its newly detected environment.

Moreover, because the different configuration files and/or configuration file portions may be stored in the NVM at the time of the VR controller's manufacturing and/or retrieved from a BMC, the VR controller may only need a single P/N. All the different configuration files and/or portions may be available in all VRs (either in its NVM or through the BMC), such that there is no need to distinguish a "clean" VR controller from a "programmed" VR controller using different P/Ns.

To better illustrate the foregoing, FIG. 1 is a block diagram of IHS 100 configured according to certain embodiments. IHS 100 may include one or more processors 101. In various embodiments, IHS 100 may be a single-processor system including one processor 101, or a multi-processor system including two or more processors 101. Processor(s) 101 may include any any general-purpose or embedded processor implementing any of a variety of Instruction Set Architectures (ISAs) and capable of executing program instructions.

IHS 100 includes chipset 102 that may include one or more integrated circuits that are connect to processor(s) 101. In certain embodiments, chipset 102 may utilize a QPI (QuickPath Interconnect) bus 103 for communicating with processor(s) 101. Chipset 102 provides processor(s) 101 with access to a variety of resources. For instance, chipset 102 provides access to system memory 105 over memory bus 104. System memory 105 may be configured to store program instructions and/or data accessible by processors(s) 101. In various embodiments, system memory 105 may be implemented using any suitable memory technology, such as static RAM (SRAM), dynamic RAM (DRAM) or nonvolatile/Flash-type memory.

Chipset 102 may also provide access to a graphics processor 107. In certain embodiments, graphics processor 107 may be include within one or more video or graphics cards that have been installed as components of IHS 100. Graphics processor 107 may be coupled to chipset 102 via graphics bus 106, such as provided by an AGP (Accelerated Graphics Port) bus, or a PCIe (Peripheral Component Interconnect Express) bus. In certain embodiments, a graphics processor 107 generates display signals and provides them to display device 108.

In certain embodiments, chipset 102 may also provide access to one or more user input devices 111. In such embodiments, chipset 102 may be coupled to a super I/O controller 110 that provides interfaces for a variety of user input devices 111, in particular lower bandwidth and low data rate devices. For instance, super I/O controller 110 may provide access to a keyboard and mouse or other peripheral input devices. In certain embodiments, super I/O controller 110 may be used to interface with coupled user input devices 111 such as keypads, biometric scanning devices, and voice or optical recognition devices. The I/O devices may interface super I/O controller 110 through wired or wireless connections. In certain embodiments, chipset 102 may be coupled to the super I/O controller 110 via Low Pin Count (LPC) bus 113.

Other resources may also be coupled to processor(s) 101 of the IHS 100 through chipset 102. In certain embodiments, chipset 102 may be coupled to network interface 109, such as provided by a Network Interface Controller (NIC) that is coupled to IHS 100. In certain embodiments, network interface 109 may be coupled to chipset 102 via PCIe bus 112. According to various embodiments, network interface 109 may communicate via various wired and/or wireless networks. In certain embodiments, chipset 102 may also provide access to one or more Universal Serial Bus (USB) ports 116.

Chipset 102 also provides access to one or more solid state storage devices 115. Chipset 102 utilizes a PCIe bus interface connection 118 in order to communicate with solid state storage device 115. In certain embodiments, chipset 102 may also provide access to other types of storage devices. For instance, in addition to the solid state storage device 115, IHS 100 may also utilize one or more magnetic disk storage devices, or other types of the storage devices such as an optical drive or a removable-media drive. In various embodiments, solid state storage device 115 may be integral to IHS 100, or may be located remotely from IHS 100.

Another resource that may be accessed by processor(s) 101 via chipset 102 is a BIOS (Basic Input/Output System) 117. Upon powering or restarting IHS 100, processor(s) 101 may utilize BIOS 117 instructions to initialize and test hardware components coupled to the IHS 100 and to load an operating system for use by the IHS 100.

More generally, BIOS 117 provides an abstraction layer that allows the IHS's Operating System (OS) to interface with certain hardware components. Using this hardware abstraction layer provided by BIOS 117, the software application executed by the processor(s) 101 of IHS 100 is able to interface with certain I/O devices that are coupled to IHS 100.

In various embodiments, IHS 100 may not include each of the components shown in FIG. 1. Additionally or alternatively, IHS 100 may include various components in addition to those that are shown in FIG. 1. Furthermore, some components that are represented as separate components in FIG. 1 may, in some embodiments, be integrated with other components. For example, in various implementations, all or a portion of the functionality provided by the illustrated components may instead be provided by components integrated into the one or more processor(s) 101 as a system-on-a-chip (SOC) or the like.

As such, FIG. 1 shows various internal components of an example IHS 100 configured to implement systems and methods described herein. It should be appreciated, however, that other implementations may be utilized with any other type of IHSs (e.g., smart phones, smart watches, tablets, etc.).

As discussed in more detail below, IHS 100 may be at least in part powered by VR 200. In this example, VR 200 provides voltage rail 207 to processor(s) 101 alone, but that is for ease of explanation only. It should be noted that, in various embodiments, voltage rail 207 may be additionally or alternatively provided to any other component within IHS 101 (e.g., chipset 102, etc.) via a power bus or the like. In addition to providing voltage rail 207 to processor(s) 101 and/or other IHS components, VR 200 may further include communication bus or channel 209, for example, through which the VR is capable of exchanging information with BMC 117 via chipset 102 or the like.

Figure 2:
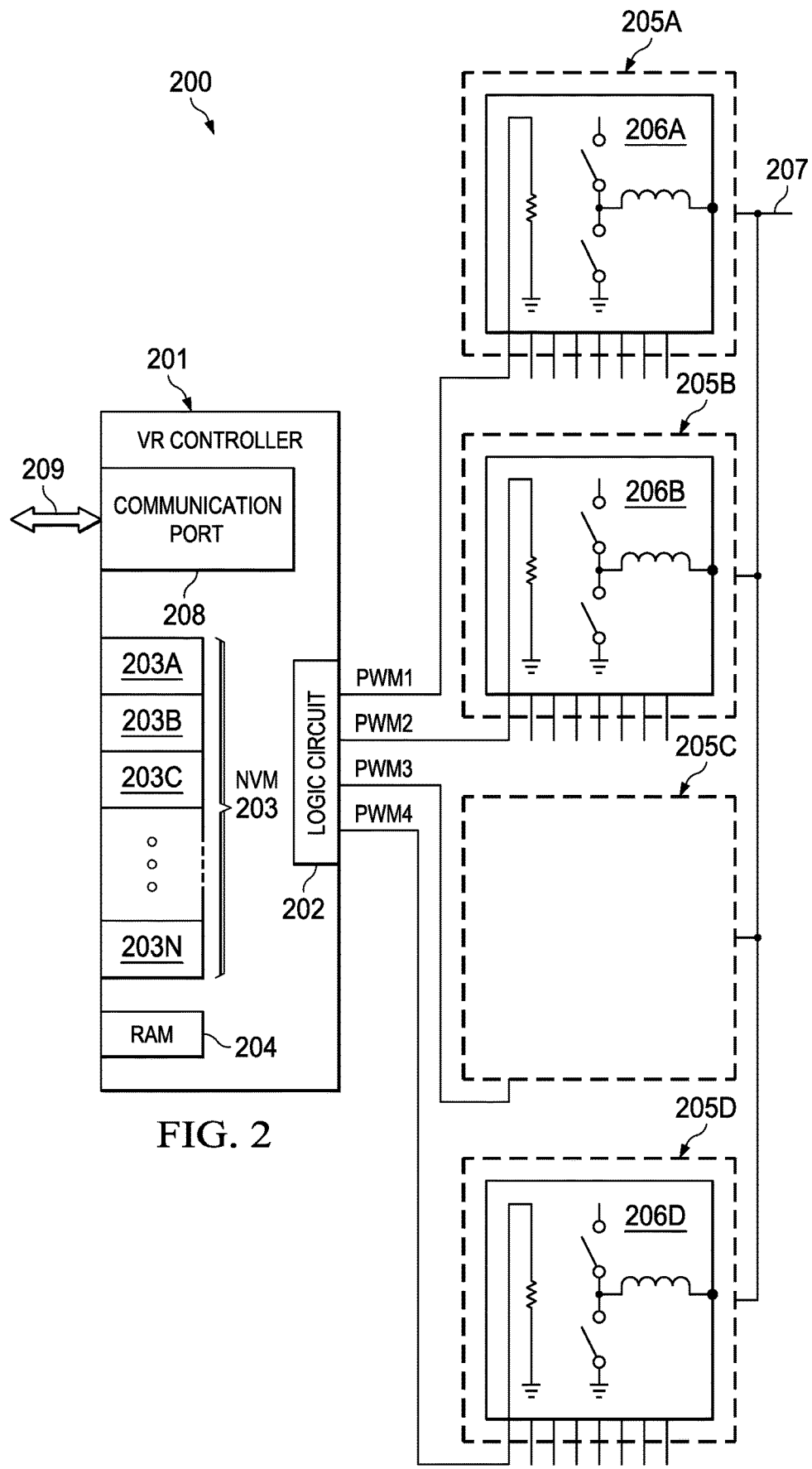
FIG. 2 illustrates an example of a voltage regulator (VR) controller according to some embodiments.

FIG. 2 illustrates an example of VR controller 201 within VR 200. In some embodiments, VR 200 may be mounted on the same Printed Circuit Board (PCB) as IHS 100. Generally speaking, VR controller 201 controls and/or directs power modules 206A-N, also known as "phases," to provide a selected voltage level at output rail 207, which may then be used to power processor(s) 101 and/or other components shown in FIG. 1.

In this particular example, VR 200 has four bays 205A-205D. Bay 205A includes or is otherwise coupled to power module or phase 206A. Bay 205B includes or is otherwise coupled to power module or phase 206B. Bay 205C happens to not have a corresponding power module coupled to it. In some cases, the missing power module in bay 205C may be physically absent. In other cases, the missing power module in bay 205C may be present but not required for the proper operation of the CPU. In yet other cases, the missing power module in bay 205C may have failed during operation. Finally, bay 205D includes or is otherwise coupled to power module or phase 206D.

VR controller 201 provides Pulse-Width Modulated (PWM) signals 1-4 to each respective bay 205A-205D using settings and parameters stored in the retrieved and/or dynamically assembled configuration file. Each PWM signal is configured to drive a corresponding power module when that power module is present and/or properly functioning in a corresponding one of bays 205A-D.

Accordingly, in order to implement certain embodiments described herein, VR controller 201 may include logic circuit 202, non-volatile memory (NVM) 203, random access memory (RAM) 204, and communication port 208.

NVM 203 may be subdivided into different areas and/or address codes 203A-N of configurable sizes, each area or address code configured to store a different VR configuration file or portion thereof. RAM 204 may include a number of control registers, each control register configured to receive a different parameter (as stored in one or more configuration files) usable to generate PWM signals 1-4. Also, in some situations, VR controller 201 may be capable of communicating with BMC 117, for example, using communication bus 209 arbitrated by chipset 102, as illustrated in this example. Additionally or alternatively, communication bus 209 may be directly coupled to BMC 117.

In operation, logic circuit 202 within VR controller 201 of FIG. 2 may be configured to perform any of operations shown in methods 300-500 of FIGS. 3-5, discussed in turn below. In each of these methods, the configuration file used by VR controller 201 may be adjustable or configurable, such that the VR controller chip and/or controller itself only requires a single P/N for any different number of power modules and/or any CPU with different power requirements.

In FIG. 2, logic circuit 202 detects which phase/power module is populated, in one example, PWM1 through PWM4 will send out a current source signal, since all the phase/power modules have a resistor at their PWM input counterpart. This will create a voltage at controller PWM1 to PWM4, if the module is populated, there will be a voltage higher than designated threshold. If there is no module populated, the voltage will be lower than designated threshold. Population detection method is not limited to this example.

Figure 3:
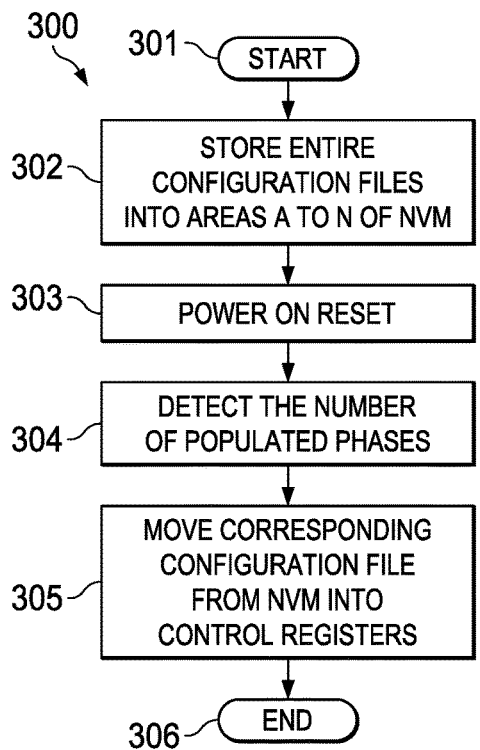
FIG. 3 illustrates an example of a method for configuring a VR controller according to some embodiments.

Referring now to FIG. 3, method 300 may be performed by VR controller 201 of FIG. 2. Particularly, method 300 begins at block 301. At block 302, each different configuration file is stored in one of areas 203A to 203N of NVM 203 in its entirety, such that each different configuration file includes all settings parameters necessary for proper operation of the VR having that particular configuration. At block 303, a power-on-reset (POR) event occurs. At block 304, VR controller 201 detects the number of populated power modules or phases (e.g., 206A, 206B, and 206D in FIG. 2) in response to the POR event.

Additionally or alternatively, at block 304, VR controller 200 may determine a number of power modules or phases required by a given CPU (e.g., processor(s) 101) by communicating with the CPU, for example, via bus 209. At block 305, method 300 correlates the number of detected power modules or phases with a corresponding memory address in the NVM to retrieve a selected configuration file for the detected or CPU-required number of phases, such that all VR parameters within the selected configuration file may be loaded into control registers of RAM 204. Method 300 ends at block 306.

In the foregoing embodiment, several configuration files may be stored in the NVM, and each entire configuration file may be correlated with a different number of populated or CPU-required phases. Each configuration file may be located in different area of the NVM and have a distinct address code. During start up, VR controller 201 may detect a number of populated or CPU-required modules or phases, and it may then use this information to load a corresponding configuration file into the control registers, for example, as a memory-to-memory operation, a Direct Memory Access (DMA) operation, etc. In some embodiments, implementing method 300 may involve increasing the size of NVM 203 to store various distinct and entire configuration files in areas 203A-N.

To determine the power requirements of any given CPU, VR controller 201 may receive a serial number, SKU, or other identifying information from processor(s) 101 (e.g., via chipset 102, and it may use that information to select one of the plurality of configuration files stored in NVM 203 that matches that identification. Additionally or alternatively, processor(s) 101 may provide its power requirement information to VR controller 201 explicitly (e.g., 100 W) without the need for exchanging CPU identification information.

Figure 4:
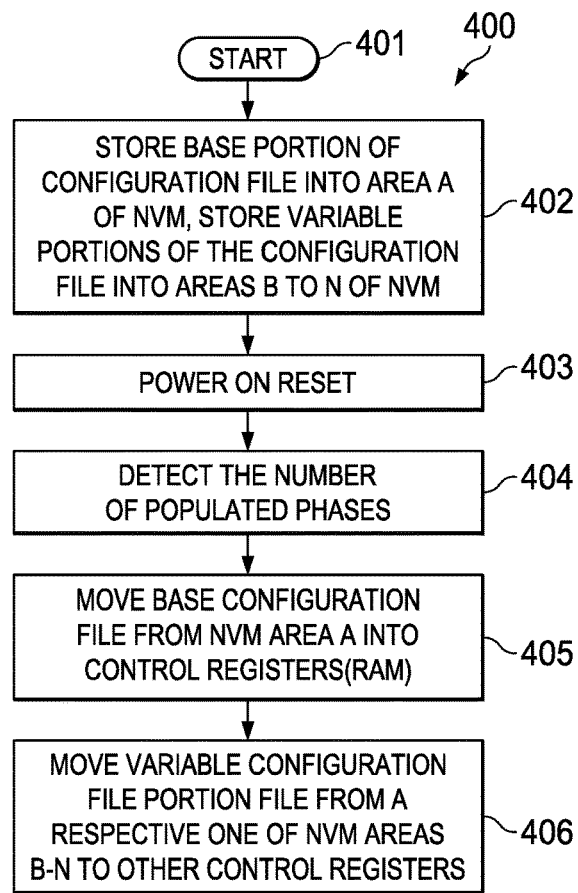
FIG. 4 illustrates an example of another method for configuring a VR controller according to some embodiments.
Figure 5:
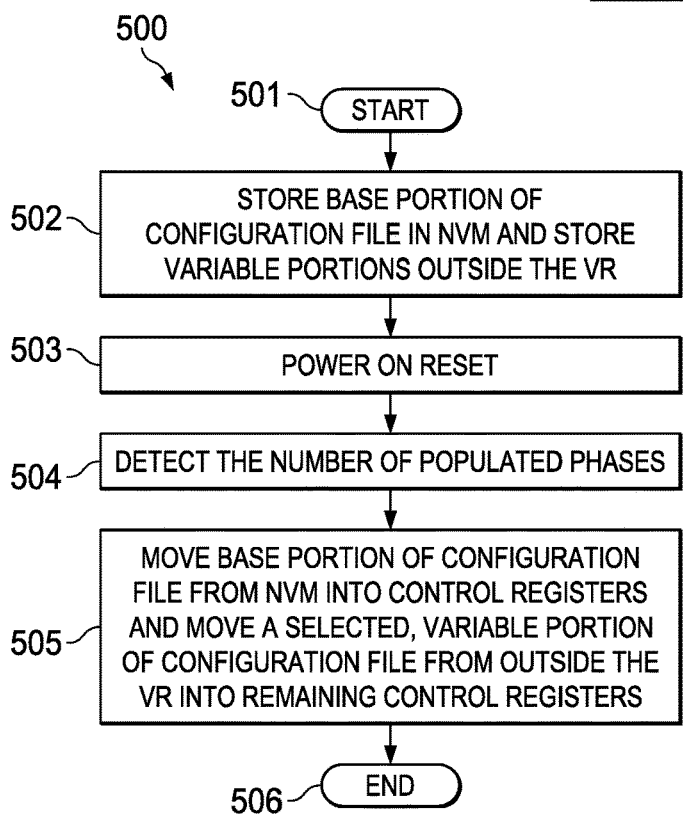
FIG. 5 illustrates an example of yet another method for configuring a VR controller according to some embodiments.

As noted above, in some cases the configuration file (or a portions thereof, as shown in FIG. 4 or 5) may be selected or assembled based upon a CPU's power requirements. Additionally or alternatively, the configuration file (or a portion thereof) may be selected or assembled based upon a number of phases coupled to the VR. Yet additionally or alternatively, both the CPU power requirement and the number of phases coupled to the VR may be used to select or assemble the configuration file (or a portion thereof).

As an example, VR controller 201 may determine, based upon the number of phases coupled to VR 200, that VR 200 can only provide a certain amount of power that is less than the CPU's nominal power requirements (e.g., when a power module is absent or has failed), it may select or assemble a configuration file for the maximum amount of power it can provide, and it may notify the CPU to operate in a diminished capacity (e.g., turn off selected components, operate at a lower frequency than the nominal frequency, etc.). Conversely, VR controller 201 may determine that it has more phases or power modules coupled to it than necessary to fulfill the CPU's power requirements, and it may turn off a given power module by shutting down its respective PWM signal (e.g., if power module "206A" is physically coupled to bay 205C but not needed by the CPU, it would still not receive a "PWM1" signal).

In another example, VR controller 201 may provide an indication that an additional power module needs to be coupled to VR 200 in order to fulfill the CPU's power requirements for its proper operation, for example, at a nominal frequency. Additionally or alternatively, VR controller 201 may provide an indication that an additional power module should be coupled to VR 200 in order to fulfill the CPU's power requirements for proper operation at a turbo or over-clocked frequency. In some cases, these indications may be provided to an end-user using the IHS's user interface, and new configuration files may be selected and/or assembled automatically in response to the additional power module being inserted into the VR.

In FIG. 4, method 400 may also be performed by VR controller 201. Similarly as in FIG. 3, here method 400 begins at block 401. At block 402, method 400 stores a first, base portion of a configuration file in a selected area of NVM 203 (e.g., area 203A), and a plurality of second configuration file portions may be stored in areas 203B-N of NVM 203, each second portion differing from one another as a function of the number of detected power modules or phases and/or a CPU's power requirements. For example, a base configuration file portion may include fixed parameters and values usable by VR controller 201 regardless of the detected or CPU-required number of phases or power modules, whereas each second configuration file portion in areas 203B-N may include other parameters and values that are specific to the detected or CPU-required number of phases or power modules.

At block 403, a POR event is detected. At block 404, VR controller 201 detects the number of populated and/or CPU-required modules or phases. At block 405, method 400 retrieves the base portion of the configuration file from NVM area 203A into respective control registers. Then, at block 406, method 400 retrieves an second configuration file portion (e.g., from area 203B or any other area that corresponds to the number of detected phases) into the remaining control registers. Method 400 ends at block 407.

As such, method 400 enables storage of a base portion of the configuration file into area A, while it stores different, selectable portions of the configuration file into NVM areas B-N, such that each second portion is correlated with one set of present or required number of phases. During start-up, VR controller 201 loads the base portion of the configuration file into control registers (RAM), detects populated phase numbers, and then uses this information to select and load a corresponding second portion of the resulting configuration file into the remaining control registers.

Again, in method 400, the end configuration file used by VR controller 201 is made up of at least two portions: (a) a base portion that is phase independent, combined with (b) a selected one of a plurality of phase-dependent portions. In various implementations, only a subset of the configuration file settings and parameters may vary according to the number of detected or CPU-required phases, such that the base portion of the configuration file may be larger than each additional, custom, and/or phase-dependent configuration file portion.

Referring to FIG. 5, method 500 may also be performed by VR controller 201. Again, method 500 begins at block 501. At block 502, method 500 stores the base portion of a configuration file into NVM 203. At block 503, a POR event is detected. At block 504, VR 201 controller detects the number of populated or CPU-required modules or phases.

At block 505, method 500 retrieves the base configuration file from the NVM and stores its parameters or settings in their respective control registers. Then, method 500 retrieves a selectable, second portion of the configuration file from BMC 117, and stores those parameters or settings into the remaining control registers. Method 500 ends at block 506.

That is, in method 500, at start-up, VR controller 201 detects the number of populated or CPU-required phases, and then communicates that information to BMC 117. The VR controller 201 loads the base portion of the configuration file in its NCM into their respective control registers, and BMC 117 provides the remaining registers with selected, phase-dependent settings or parameters that are at least initially only stored outside of VR 200. For example, in some cases, BMC 117 may be coupled to a network (e.g., the Internet), and it may retrieve or update one or more settings or parameters from a remote IHS (e.g., "from the cloud").

In many of the situations described above, an end-user may plug in any number of power modules based on their needs and/or CPU load power level, without manual VR controller configuration file changes, and the configuration file may be automatically selected and/or assembled on-the-fly, at least in part, by VR controller 201. Also, based on the presence or need of each phase module, the assembled configuration file may configure VR controller 201 to set up different PWM signal profiles. For example, if bay 3 is not populated but bay 4 is populated, as shown in FIG. 2, the final configuration file may instruct VR controller 201 to only send PWM signals through PWM1, PWM2, and PWM4; but not through PWM3.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
a processor; and
a voltage regulator (VR) coupled to the processor, the VR configured to:
   detect, via a VR controller, a number of phase modules coupled to the VR in response to detection of a power-on-reset event, wherein the detection of the number of phase modules comprises: identification of an absence of a phase module, abstention from sending a Pulse-Width Modulated (PWM) signal to a bay corresponding to the absent phase module, and detection of a PWM signal from bays corresponding to a populated phase module;
   select, via the VR controller, one of a plurality of different configuration files to be applied to the VR, at least in part, based upon the detection of the number of phase modules;
   determine that the detected number of phase modules does not fulfill a power requirement of the processor; and
   notify the processor to operate in a diminished capacity;
a Random-Access Memory (RAM) having a plurality of control registers;
a Non-Volatile Memory (NVM) coupled to the RAM, wherein the NVM comprises the plurality of different configuration files, wherein each of the plurality of configuration files corresponds to a different number of phase modules coupled to the VR; and
a logic circuit coupled to the NVM and to the RAM, wherein the logic circuit is configured to detect the number of phase modules, retrieve the selected configuration file from the NVM, and load configuration parameters from the selected configuration file into corresponding ones of the control registers in the RAM, wherein the logic circuit is further configured to create a full configuration file by combining (a) a first configuration file portion applicable to any number of phase modules, with (b) a second configuration file portion selected among a plurality of other configuration file portions, each of the plurality of other configuration file portions having different parameters specific to different numbers of phase modules, wherein the first configuration file portion is stored in a first area of the NVM and the second configuration file portion is stored in a second area of the NVM.

2. The IHS of claim 1, wherein the first configuration file portion is stored in the NVM and wherein the second configuration file portion is stored in a Baseband Management Controller (BMC) coupled to the processor.

3. The IHS of claim 1, the IHS further comprising a Baseband Management Controller (BMC), wherein the BMC is configured to receive an indication of the number of phase modules usable by the processor and to provide the selected configuration file to the VR voltage regulator.

4. A voltage regulator (VR) controller, comprising:
a Random-Access Memory (RAM) having a plurality of control registers;
a Non-Volatile Memory (NVM) coupled to the RAM, wherein the NVM comprises a plurality of different VR configuration parameters; and
a logic circuit coupled to the NVM and to the RAM, wherein the logic circuit is configured to:
select first VR configuration parameters, at least in part, based upon a detection, by the logic circuit, of a first number of phase modules coupled to a VR that the VR controller controls, wherein the detection of the first number of phase modules comprises: identification of an absence of a phase module, abstention from sending a Pulse-Width Modulated (PWM) signal to a bay corresponding to the absent phase module, and detection of a PWM signal from bays corresponding to a populated phase module;
load the first VR configuration parameters into a corresponding control register in the RAM;
detect a power-on-reset event;
select second VR configuration parameters, at least in part, based upon a detection, by the logic circuit, of a second number of phase modules coupled to the VR, wherein the detection of the second number of phase modules comprises: identification of an absence of a phase module, abstention from sending a PWM signal to a bay corresponding to the absent phase module, and detection of a PWM signal from bays corresponding to a populated phase module; and
load the second VR configuration parameters into the corresponding control register in the RAM, wherein one or more configuration parameters in the first VR configuration parameters and the second VR configuration parameters is independent of the first number of phase modules and the second number of phase modules coupled to the VR, wherein the logic circuit is configured to retrieve a base configuration file portion from a first area of the NVM, wherein the base configuration file portion comprises the one or more configuration parameters, and wherein the logic circuit is further configured to retrieve, from a second area of the NVM, a variable configuration file portion for the first VR configuration parameters according to the first number of phase modules and a variable configuration file portion for the second VR configuration parameters according to the second number of phase modules.

5. The VR controller of claim 4, wherein the logic circuit is configured to retrieve a variable configuration file portion from a Baseband Management Controller (BMC) in an Information Handling System (IHS).

6. A method, comprising:
detecting, by a controller within a voltage regulator (VR), a number of phase modules coupled to the VR to power a device, wherein the detection of the number of phase modules comprises: identifying an absence of a phase module, abstaining from sending a Pulse-Width Modulation (PWM) signal to a bay corresponding to the absent phase module, and detecting a PWM signal from bays corresponding to a populated phase module, wherein the detection of the number of phase modules is performed in response to a power-on-reset after the VR has already been coupled to the device;
selecting or assembling, by the controller, a configuration file, wherein the selected or assembled configuration file is based upon the detected number of phase modules, wherein a first portion of the configuration file is independent of the detected number of phase modules, wherein a second portion of the configuration file depends upon the detected number of phase modules, and wherein the first portion of the configuration file is stored in a first area of the VR and the second portion of the configuration file is stored in a second area of the VR;
determining that a current number of phase modules does not fulfill a power requirement of a processor; and
notifying the processor to operate in a diminished capacity.

7. The method of claim 6, further comprising loading configuration parameters from the selected or assembled configuration file into registers within the VR regulator.

8. The method claim 6, further comprising selecting the first portion of the configuration file from a first address of a memory within the VR.

9. The method claim 8, further comprising selecting the second portion of the configuration file from a second address of the memory.

10. The method claim 8, further comprising receiving the second portion of the configuration file from a Baseband Management Controller (BMC).

* * * * *

UNITED STATES PATENT AND TRADEMARK OFFICE
CERTIFICATE OF CORRECTION

PATENT NO. : 10,998,072 B2  
APPLICATION NO. : 15/599903  
DATED : May 4, 2021  
INVENTOR(S) : Mirjafari et al.

Page 1 of 1

It is certified that error appears in the above-identified patent and that said Letters Patent is hereby corrected as shown below:

In the Claims

In Column 11, Line 13, Claim 3, delete "the VR voltage regulator." and insert -- the VR. -- therefor.

Signed and Sealed this  
First Day of June, 2021

Drew Hirshfeld  
*Performing the Functions and Duties of the*  
*Under Secretary of Commerce for Intellectual Property and*  
*Director of the United States Patent and Trademark Office*